United States Patent
Choi

(10) Patent No.: US 8,895,988 B2
(45) Date of Patent: Nov. 25, 2014

(54) ELECTROSTATIC DISCHARGE DEVICE AND ORGANIC ELECTRO-LUMINESCENCE DISPLAY DEVICE HAVING THE SAME

(71) Applicant: LG Display Co., Ltd., Seoul (KR)

(72) Inventor: Hee Dong Choi, Seonsan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/163,522

(22) Filed: Jan. 24, 2014

(65) Prior Publication Data

US 2014/0139103 A1    May 22, 2014

Related U.S. Application Data

(62) Division of application No. 12/005,359, filed on Dec. 27, 2007, now Pat. No. 8,637,867.

(30) Foreign Application Priority Data

Dec. 28, 2006  (KR) .................. 10-2006-0135873

(51) Int. Cl.
*H01L 29/04*  (2006.01)
*H01L 27/02*  (2006.01)
*H05B 33/14*  (2006.01)
*H01L 27/32*  (2006.01)

(52) U.S. Cl.
CPC ........ *H01L 27/0266* (2013.01); *H01L 27/0296* (2013.01); *H05B 33/14* (2013.01); *H01L 27/3244* (2013.01); *G09G 2330/04* (2013.01)

USPC ............... 257/59; 257/43; 257/66; 257/72; 257/197

(58) Field of Classification Search
CPC . H01L 27/32; H01L 27/3202; H01L 27/3225; H01L 27/3258; H01L 27/0266; H01L 27/3244
See application file for complete search history.

(56) References Cited

U.S. PATENT DOCUMENTS 6,812,528 B2    11/2004  Uchida
6,927,420 B2 *   8/2005  Kim ................... 257/72
2005/0140836 A1 *  6/2005  Choi ................. 349/40
2007/0065997 A1 *  3/2007  Lin .................. 438/158

FOREIGN PATENT DOCUMENTS

KR    10-2005-0122699    12/2005

* cited by examiner

*Primary Examiner* — Kyoung Lee
(74) *Attorney, Agent, or Firm* — McKenna Long & Aldridge LLP

(57) ABSTRACT

An electrostatic discharge device and an organic electro-luminescence display device having the same are provided. The organic electro-luminescence display device includes an electrostatic discharge device including a metal pattern having an island shape on a substrate, an insulating layer on the metal pattern, a semiconductor pattern on the insulating layer, the semiconductor pattern corresponding to the metal pattern, a first electrode overlapping one end of the semiconductor pattern, and a second electrode overlapping the other end of the semiconductor pattern, and spaced from the first electrode, thereby preventing a current leakage, a signal distortion and a signal cross-talk to improve the reliability.

6 Claims, 3 Drawing Sheets

ELECTROSTATIC DISCHARGE DEVICE AND ORGANIC ELECTRO-LUMINESCENCE DISPLAY DEVICE HAVING THE SAME

CROSS-REFERENCE TO RELATED APPLICATIONS

This application is a Divisional of application Ser. No. 12/005,359 filed Dec. 27, 2007, now allowed, which claims priority to Korean Patent Application No. 10-2006-0135873, filed Dec. 28, 2006, all of which are hereby incorporated by reference for all purposes as if fully set forth herein.

BACKGROUND OF THE INVENTION

1. Field of the Invention

The present invention relates to an electrostatic discharge device, and more particularly, to an organic electro-luminescence display device having the same.

2. Discussion of the Related Art

A cathode ray tube (CRT) has been widely used for a display device such as a television and a monitor. However, the CRT has some limitations such as heavy weight and large size, and a high driving voltage. For this reason, a flat panel display having many advantages of a lightweight slim profile and low power consumption has come to the front in recent years. Many researches for developing various flat panel displays such as a liquid crystal display (LCD) device, a plasma display panel (PDP), a field emission display (FED) and an organic electro-luminescence diode (also referred to as a electro-luminescence diode; ELD) have been carried out.

The organic electro-luminescence display device is in the limelight as a display device that can display natural colors since the organic electro-luminescence display device can emit light in an entire visible region. Also, the organic electro-luminescence display device has high brightness and a low operation voltage characteristic. The organic electro-luminescence display device is a self-luminous display device, and therefore has a high contrast ratio. Also, the organic electro-luminescence display device can be realized as an ultra-thin display device using a simple process, and generates small pollution to the environment. Also, since the organic electro-luminescence display device has a response time of several micro seconds (µs), it is suitable for displaying a moving image. The organic electro-luminescence display device has no limitation of a viewing angle. Furthermore, the organic electro-luminescence display device is stable at a low temperature. Since the organic electro-luminescence display device may be driven at a low direct current voltage of about 5 V to 15 V, it is easy to manufacture and design a driving circuit of the organic electro-luminescence display device.

The organic electro-luminescence display device includes a plurality of pixels arranged in a matrix configuration to reduce a drive voltage and improve image quality. The plurality of the pixels are defined by a plurality of gate lines crossing a plurality of data lines. In this case, an active matrix connecting a switching device and a driving device to each pixel is applied to the organic electro-luminescence display device.

A substrate is provided to manufacture an active matrix organic electro-luminescence display device. Thereafter, a plurality of lines, a switching device and a driving device, a first electrode, an organic emission layer and a second electrode are formed on the substrate. At this point, the substrate is fixed to a robot arm and transferred to a corresponding processing unit. The substrate may contact the robot arm and other equipments frequently, so that a static electricity may be generated to the substrate. The static electricity may cause an electrical defect such as disconnection and short circuit, causing a critical damage to the lines (gate lines, data lines, etc.) formed on the substrate.

SUMMARY OF THE INVENTION

Accordingly, the present invention is directed to electrostatic discharge device and organic electro-luminescence display device having the same that substantially obviates one or more of the problems due to limitations and disadvantages of the related art.

An advantage of the present invention is to provide an electrostatic discharge device for effectively removing static electricity and easily being designed.

Another advantage of the present invention is to provide an organic electro-luminescence display device for effectively removing and preventing damages and defects of a panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an electrostatic discharge device includes: a metal pattern having an island shape on a substrate; an insulating layer on the metal pattern; a semiconductor pattern on the insulating layer, the semiconductor pattern corresponding to the metal pattern; a first electrode overlapping one end of the semiconductor pattern; and a second electrode overlapping the other end of the semiconductor pattern, and spaced from the first electrode.

In another aspect of the present invention, an electrostatic discharge device includes: an insulating layer on a substrate; a semiconductor pattern on the insulating layer; a first electrode overlapping one end of the semiconductor pattern; and a second electrode overlapping the other end of the semiconductor pattern and spaced from the first electrode.

In yet another aspect of the present invention, an organic electro-luminescence display device includes: a first substrate where an image display region and an image non-display region are defined; at least one thin film transistor in a pixel region defined by a gate line and a data line crossing each other in the image display region; an electrostatic discharge device in the image non-display region, the electrostatic discharge device being on one end of the gate line; and an organic light emitting device on the image display region, the electrostatic discharge device including: a metal pattern having an island shape on the substrate; an insulating layer on the metal pattern; a semiconductor pattern on the insulating layer, the semiconductor layer corresponding to the metal pattern; a first electrode overlapping one end of the semiconductor pattern and connected to the gate line; and a second electrode overlapping the other end of the semiconductor pattern, and spaced from the first electrode.

In yet another aspect of the present invention, an organic electro-luminescence display device includes: a first substrate where a image display region and image non-display region are defined; at least one film transistor on a pixel region defined by a gate line and a data line crossing each other; an electrostatic discharge device on the image non-display region and one end of the gate line; and an organic light emitting device on the image display region, wherein the electrostatic discharge device includes: an insulating layer on the substrate; a semiconductor pattern on the insulating layer; a first electrode overlapping one end of the semiconductor pattern and connected to the gate line; and a second electrode overlapping the other end of the semiconductor pattern, and spaced from the first electrode.

It is to be understood that both the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Hereinafter, an organic electro-luminescence display device will be fully described with reference to the accompanying drawings.

Figure 1:
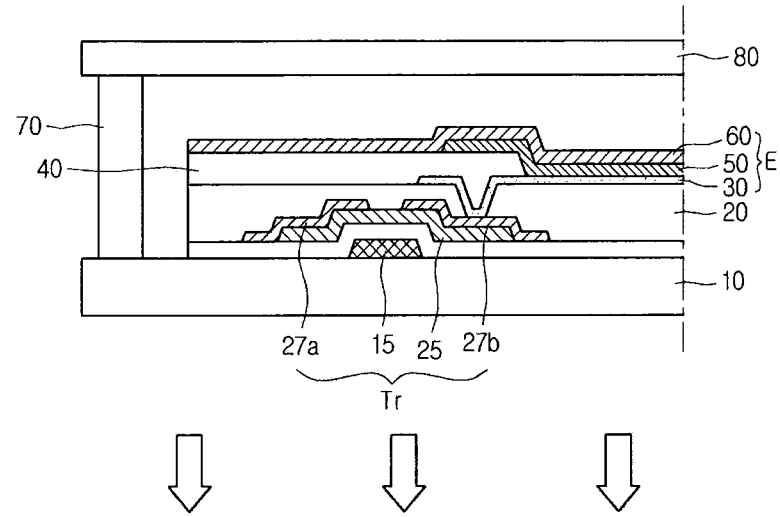
FIG. 1 is a cross sectional view illustrating an organic electro-luminescence display device according to the present disclosure.

FIG. 1 is a cross sectional view illustrating an organic electro-luminescence display device according to the present disclosure, which illustrating a cross sectional structure of an active matrix type operated in a bottom light emitting method.

However, a static electricity preventing pattern according to the present disclosure is applicable to an organic electro-luminescence display device of an active matrix type operated in a top emitting method, and is also applicable to an organic electro-luminescence display device of which a organic light emitting device and array devices are respectively formed in different substrates.

Referring to FIG. 1, a thin film transistor (TFT) Tr is formed on a substrate 10. The TFT Tr includes a gate electrode 15, an active layer 25, a source electrodes 27a, and a drain electrode 27b.

The substrate 10 includes a passivation layer 20 having a contact hole exposing a portion of the drain electrode 27b.

A first electrode 30 is formed on the passivation layer 20, and is electrically connected to the drain electrode 27b via the contact hole.

An insulating layer 40 where a sub-pixel region is defined is disposed on the first electrode 30. An organic emission layer 50 is disposed on the first electrode 30 of the sub-pixel region. A second electrode 60 serving as a common electrode is disposed on the organic emission layer 50. Here, the first and second electrodes 30 and 60 apply an electric field to the organic emission layer 50 so that the organic emission layer 50 can emit light.

After a sealant 70 is coated on an outer edge of the substrate 10 in order to protect the organic light-emitting diode device E formed on the substrate 10 from external humidity and oxygen, an encapsulating substrate 80 is attached to face the organic light-emitting diode device E, so that the organic electro-luminescence display device can be manufactured.

During the manufacturing process of the substrate having the TFT, a high voltage such as static electricity may be generated inside or outside the device. Accordingly, only when the high voltage is appropriately removed, it is possible to manufacture a normal organic electro-luminescence display device.

Figure 2:
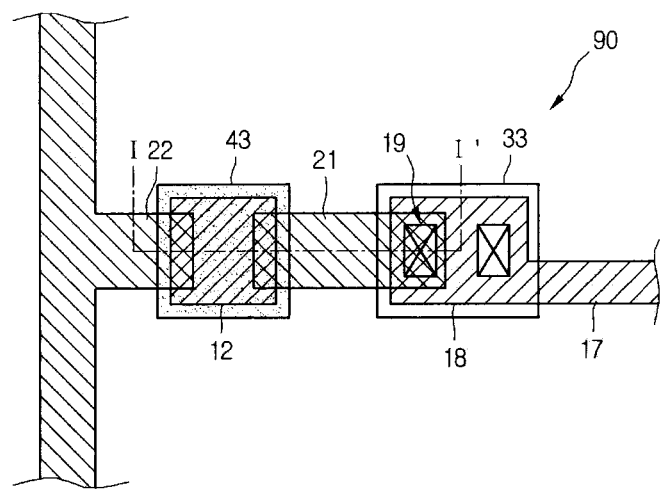
FIG. 2 is a plan view illustrating an electrostatic discharge device formed between one end of a gate line and a shorting bar according to an embodiment.
Figure 3:
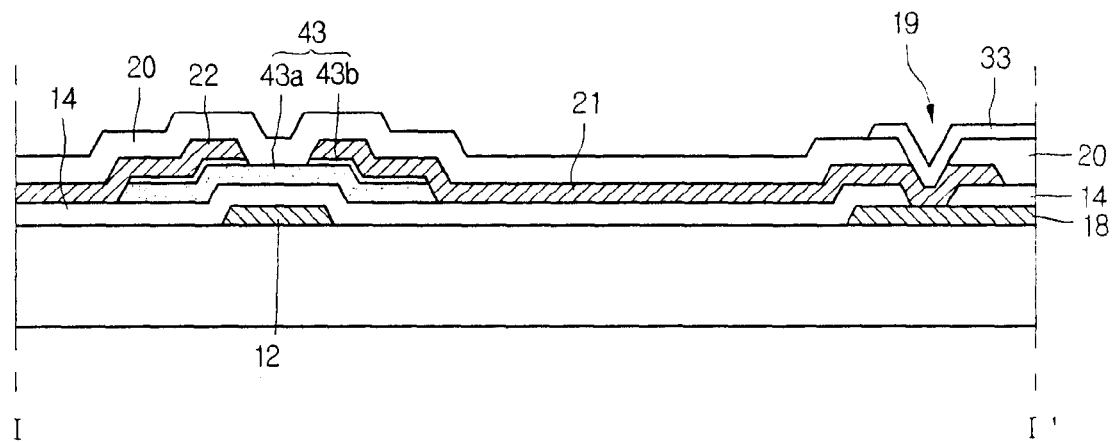
FIG. 3 is a cross sectional view illustrating an electrostatic discharge device taken along line I-I' in FIG. 2.

FIG. 2 is a plan view illustrating an electrostatic discharge device formed between one end of a gate line and a shorting bar according to an embodiment. FIG. 3 is a cross sectional view illustrating an electrostatic discharge device taken along line I-I' in FIG. 2.

Although the electrostatic discharge device is disposed on one end of a gate line illustrated in FIG. 2, the electrostatic discharge device may be also disposed on one end of a data line.

Referring to FIGS. 2 and 3, an electrostatic discharge device 90 according to an embodiment includes a first electrode 21, a second electrode 22, a semiconductor pattern 43 and a floating gate electrode 12. The first electrode 21 is connected to a gate pad 18 formed on one end of a gate line 17. The second electrode 22 is spaced from the first electrode 21, and is connected a shorting bar. The semiconductor pattern 43 is formed between the first electrode 21 and the second electrode 22. The floating gate electrode 12 is formed under the semiconductor pattern 43.

A transparent 33 may be further formed on the gate pad 18. The first electrode 21 is connected to the gate pad 18 via the contact hole 19 exposing a predetermined portion of the gate pad 18.

A first insulating layer 14 is formed between the first floating gate electrode 12 and the semiconductor pattern 43.

The floating gate electrode 12 may be formed in the same process as the process of forming the gate electrode 15.

A floating voltage is applied to the floating gate electrode 12

The first and second electrodes 21 and 22 overlap both ends of the semiconductor pattern 43.

The first and second electrodes 21 and 22 may be formed in the same process as the process of forming the source and drain electrodes 27a and 27b.

The semiconductor pattern 43 may be formed in the same process as the process of forming the active layer 25.

The semiconductor pattern 43 includes a first semiconductor pattern 43a and a second semiconductor pattern 43b. The second semiconductor pattern 43b formed of amorphous silicon layer is stacked on the first semiconductor pattern 43a formed of amorphous silicon layer implanted with impurities.

The second semiconductor pattern 43b may be formed on an exposed region between the first electrode 21 and the second electrode 22. Also, the second semiconductor pattern 43b may be etched to remain only under the first and second electrodes 21 and 22.

When a high voltage such as static electricity is applied to the first electrode 21 or the second electrode 22, electric charges of the semiconductor pattern 43 are concentrated on an electrode where a higher voltage is applied, thereby forming a channel. The static electricity is discharged through the channel.

Since only a general signal of the general gate line 17 or the data line may not operate the electrostatic discharge device 90, a risk of current leakage does not exist. Also, since a semiconductor layer of the electrostatic discharge device serves as a channel during occurrence of the static electricity with high voltage, the static electricity can be discharged through the shorting bar.

The electrostatic discharge device may be operated only when the static electricity occurs, thereby preventing defects due to the static electricity. Also, the organic electro-luminescence display device provided with the electrostatic discharge device can prevent deterioration of image quality, and reduce consumption of electric power.

Furthermore, the organic electro-luminescence display device according to the present disclosure can prevent a current leakage, a signal distortion and a signal cross-talk to improve the reliability.

Figure 4:
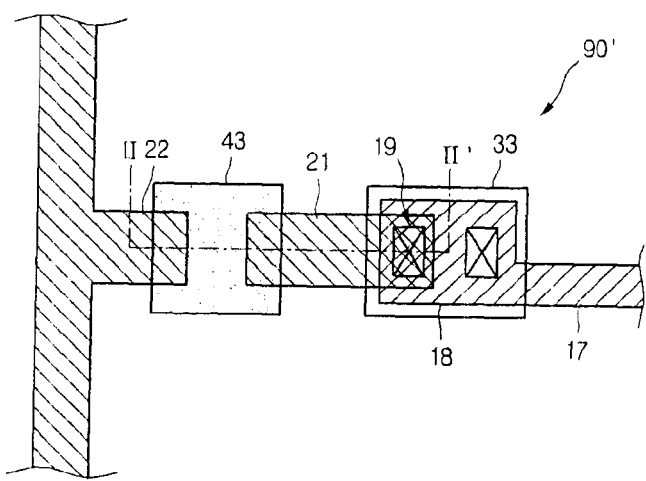
FIG. 4 is a plan view illustrating an electrostatic discharge device formed between one end of a gate line and a shorting bar according to another embodiment.
Figure 5:
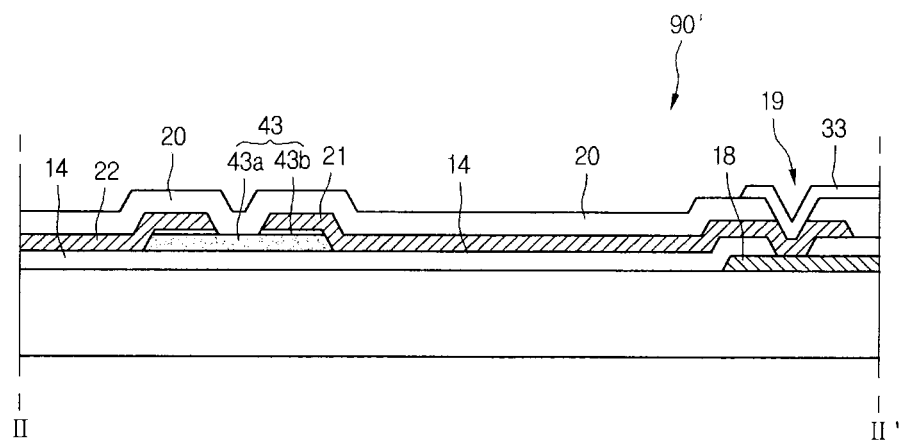
FIG. 5 is a cross sectional view illustrating an electrostatic discharge device taken along line II-II' in FIG. 4.

FIG. 4 is a plan view illustrating an electrostatic discharge device formed between one end of a gate line and a shorting bar according to another embodiment. FIG. 5 is a cross sectional view illustrating an electrostatic discharge device taken along line II-II' in FIG. 4.

Although the electrostatic discharge device is disposed on one end of a gate line illustrated in FIG. 2, the electrostatic discharge device may be disposed on one end of a data line.

Referring to FIGS. 4 and 5, an electrostatic discharge device 90' according to another embodiment includes a first electrode 21, a second electrode 22 and a semiconductor pattern 43. The first electrode 21 is connected to a gate pad 18 formed on one end of a gate line 17. The second electrode 22 is spaced from the first electrode 21, and is connected a shorting bar. The semiconductor pattern 43 is formed between the first electrode 21 and the second electrode 22.

The first and second electrodes 21 and 22 overlap both ends of the semiconductor pattern 43.

The semiconductor pattern 43 includes a first semiconductor pattern 43a and a second semiconductor pattern 43b. The second semiconductor pattern 43b formed of amorphous silicon layer is stacked on the first semiconductor pattern 43a formed of amorphous silicon layer implanted with impurities.

The second semiconductor pattern 43b may be formed on an exposed region between the first electrode 21 and the second electrode 22. Also, the second semiconductor pattern 43b may be etched to remain only under the first and second electrodes 21 and 22.

When a high voltage such as static electricity is applied to the first electrode 21 or the second electrode 22, electric charges of the semiconductor pattern 43 are concentrated on an electrode where a higher voltage is applied, thereby forming a channel. The static electricity is discharged through the channel.

Since only a general signal of the general gate line 17 or the data line may not operate the electrostatic discharge device 90', a risk of current leakage does not exist. Also, since a semiconductor layer of the electrostatic discharge device serves as a channel during existence of the static electricity with high voltage, the static electricity can be discharged through the shorting bar.

Since the electrostatic discharge devices 90 and 90' according to the first and second embodiments has a design area smaller than a prior art electrostatic discharge device, extra area can be converted into a Vss region or a Vdd region.

Also, although a signal applied to a gate line or a data line has a voltage within a range of approximately 15V to a static electricity voltage, a channel of the electro-static discharge device will not be opened, thereby preventing applying an unnecessary signal to the gate line in the panel. Accordingly, it is possible to prevent deterioration of image quality, and to reduce consumption of electric power due to a current leakage.

The electrostatic discharge device may be operated only when the static electricity occurs, thereby preventing defects due to the static electricity. Also, the organic electro-luminescence display device provided with the electrostatic discharge device can prevent deterioration of image quality, and reduce consumption of electric power.

Furthermore, the organic electro-luminescence display device according to the present disclosure can prevent a current leakage, a signal distortion and a signal cross-talk to improve the reliability.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electrostatic discharge device comprising:
   an insulating layer on a substrate;
   a semiconductor pattern on the insulating layer;
   a first electrode overlapping one end of the semiconductor pattern and connected to a gate pad formed on one end of a gate line; and
   a second electrode overlapping the other end of the semiconductor pattern and spaced from the first electrode, and connected to a shorting bar,
   wherein the second electrode and the shorting bar are formed of a single body, and
   wherein the second electrode and the first electrode are contacted with a portion of the semiconductor pattern in an overlapped region.

2. The electrostatic discharge device according to claim 1, wherein the semiconductor pattern comprises:
   a first semiconductor pattern formed of an amorphous silicon layer; and
   a second semiconductor pattern on the first semiconductor pattern, the second semiconductor layer being formed of an amorphous silicon layer doped with impurities.

3. An organic electro-luminescence display device comprising:
   a first substrate where an image display region and an image non-display region are defined;
   at least one film transistor on a pixel region defined by a gate line and a data line crossing each other in the image display region;
   a first electrostatic discharge device in the image non-display region, the first electrostatic discharge device being on one end of the gate line;
   a shorting bar on the non-display region;

an organic light emitting device on the image display region, wherein the electrostatic discharge device comprises:

a first insulating layer on the substrate;

a first semiconductor pattern on the first insulating layer;

a first electrode overlapping one end of the first semiconductor pattern and connected to the gate line; and a second electrode overlapping the other end of the first semiconductor pattern and spaced from the first electrode, wherein the second electrode of the first electrostatic discharge is connected to the shorting bar, and wherein the first electrode of the first electrostatic discharge is connected to the gate pad formed on the end of the gate line, wherein the second electrode of the first electrostatic discharge device and the shorting bar is formed of a single body, and wherein the second electrode and the first electrode of the first electrostatic discharge device are contacted with a portion of the semiconductor pattern in an overlapped region.

4. The organic electro-luminescence display device according to claim 3, wherein the thin film transistor comprises:

a gate electrode on the substrate, the gate electrode being formed in the same layer as that of the gate line and connected to the gate line;

a second insulating layer on the gate electrode;

a second semiconductor pattern on the second insulating layer, the second semiconductor pattern corresponding to the gate electrode;

a source electrode overlapping one end of the second semiconductor pattern and connected to the data line; and a drain electrode overlapping the other end of the second semiconductor pattern and spaced from the source electrode.

5. The organic electro-luminescence display device according to claim 3, wherein the semiconductor pattern comprises:

a first semiconductor pattern formed of an amorphous silicon layer; and a second semiconductor pattern on the first semiconductor pattern, the second semiconductor layer being formed of an amorphous silicon layer doped with impurities.

6. The organic electro-luminescence display device according to claim 3, further comprising an electrostatic discharge device in the image non-display region, the electrostatic discharge device being on one end of the data line, wherein the electrostatic discharge device comprises:

a third insulating layer on the substrate;

a third semiconductor pattern on the insulating layer, the third semiconductor pattern;

a third electrode overlapping one end of the third semiconductor pattern and connected to the gate line; and a fourth electrode overlapping the other end of the third semiconductor pattern, and spaced from the third electrode.

* * * * *